(12) United States Patent
Roberds et al.

(10) Patent No.: US 6,873,013 B2
(45) Date of Patent: Mar. 29, 2005

(54) SILICON-ON-INSULATOR STRUCTURE AND METHOD OF REDUCING BACKSIDE DRAIN-INDUCED BARRIER LOWERING

(75) Inventors: Brian Roberds, Escondido, CA (US); Douglas W. Barlage, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/396,950

(22) Filed: Mar. 24, 2003

(65) Prior Publication Data

US 2003/0178680 A1 Sep. 25, 2003

Related U.S. Application Data

(62) Division of application No. 10/027,047, filed on Dec. 20, 2001, now Pat. No. 6,642,133.

(51) Int. Cl.[7] ............................................. H01L 27/01
(52) U.S. Cl. ........................ 257/347; 257/349; 257/366
(58) Field of Search ................................. 257/915, 347, 257/349, 382, 366, 413

(56) References Cited

U.S. PATENT DOCUMENTS

| | | | |
|---|---|---|---|
| 5,028,559 A | 7/1991 | Zdebel et al. | |
| 5,075,241 A | 12/1991 | Spratt et al. | |
| 5,563,088 A | 10/1996 | Tseng | |
| 5,654,573 A | * 8/1997 | Oashi et al. | 257/349 |
| 5,923,986 A | 7/1999 | Shen | |
| 5,955,765 A | * 9/1999 | Yamazaki et al. | 257/366 |
| 6,013,950 A | 1/2000 | Nasby | |
| 6,121,077 A | 9/2000 | Hu et al. | |
| 6,180,985 B1 | * 1/2001 | Yeo | 257/349 |
| 6,221,764 B1 | 4/2001 | Inoue | |
| 6,333,235 B1 | 12/2001 | Lee et al. | |
| 6,399,496 B1 | 6/2002 | Edelstein et al. | |
| 6,426,543 B1 | 7/2002 | Maeda et al. | |
| 6,617,651 B2 | * 9/2003 | Ohsawa | 257/366 |
| 6,642,133 B2 | * 11/2003 | Roberds et al. | 438/595 |

* cited by examiner

*Primary Examiner*—Mark V. Prenty
(74) *Attorney, Agent, or Firm*—Blakely, Sokoloff, Taylor & Zafman LLP

(57) ABSTRACT

The invention relates to a transistor that includes a semiconductive layer on an insulator layer. Below the insulator layer is a substrate and a contact is disposed in the insulator layer that originates at the substrate and terminates in the insulator layer. The contact is aligned below the transistor junction. The invention also relates to a process flow that is used to fabricate the transistor. The process flow includes forming the contact by either a spacer etch or a directional, angular etch.

10 Claims, 9 Drawing Sheets

US 6,873,013 B2

SILICON-ON-INSULATOR STRUCTURE AND METHOD OF REDUCING BACKSIDE DRAIN-INDUCED BARRIER LOWERING

This Application is a Divisional of U.S. patent application Ser. No. 10/027,047 entitled "SILICON-ON-INSULATOR STRUCTURE AND METHOD OF REDUCING BACKSIDE DRAIN-INDUCED BARRIER LOWERING", filed on Dec. 20, 2001. now U.S. Pat. No. 6,642,133 issued Nov. 4, 2003.

FIELD OF THE INVENTION

An embodiment of the present invention relates to transistors that address drain-induced barrier lowering (DIBL). An embodiment of the present invention relates generally to integrated circuit fabrication. More particularly, an embodiment of the present invention relates to a drain disposed in a substrate.

BACKGROUND OF THE INVENTION

Description of Related Art

Advances in semiconductor process technology and digital system architecture have led to integrated circuits having increased operating frequencies. Higher operating frequencies result in undesirable increases in power consumption. Power consumption is a significant problem in integrated circuit design generally, and particularly in large scale, high speed products such as processors and microprocessors.

One way to improve integrated circuit performance, is by reducing the loading capacitance of transistors. Transistor loading capacitance generally has three components, intrinsic gate capacitance, overlap capacitance, and junction capacitance. To reduce junction capacitance, MOSFETs have been constructed on an insulating substrate such as a silicon-on-insulator (SOI) substrate. Typical SOI processes reduce junction capacitance by isolating junctions from the substrate by interposing a thick buried insulator layer. However, short-channel MOSFETs constructed with thick buried insulator layers tend to have poor punch-through characteristics, poor short-channel characteristics and other effects related to the floating body.

FIG. 1 is an elevational cross section of an existing SOI transistor 10. Transistor 10 includes a semiconductive substrate 12, an insulator 14, an isolation structure 16, a semiconductive layer 18 that includes a source/drain region 20, a channel region 22, and a salicided contact landing 24. Transistor 10 also includes a gate electrode 26, a gate dielectric layer 28, and a spacer 30.

A significant issue that arises when dealing with transistors of the present art involves current leakage from the source to the drain. One of the limiting factors in the scaling of transistors to smaller dimensions is the inability of the gate to fully control the channel region 22 below the gate. An electrical field exists between the source or drain 20 and the channel region 22. As the source and drain junctions 32 (the left junction 32 only is indicated with a reference numeral for clarity) approach one another, the lines of force 34 (the electrical field at the right junction 32 only is illustrated for clarity) resulting from the potential that is applied to the drain terminate on the source junction 32, to cause drain-induced barrier lowering (DIBL). DIBL results in a leakage current between the source and drain, and at short enough channel lengths, results in failure of the device.

BRIEF DESCRIPTION OF THE DRAWINGS

In order to illustrate the manner in which embodiments of the present invention are obtained, a more particular description of the invention briefly set forth above will be rendered by reference to specific embodiments thereof which are illustrated in the appended drawings. Understanding that these drawings depict only typical embodiments of the invention that are not necessarily drawn to scale and are not therefore to be considered to be limiting of its scope, the invention will be described and explained with additional specificity and detail through the use of the accompanying drawings in which.

DETAILED DESCRIPTION OF THE INVENTION

An embodiment of the present invention relates to a process flow and a device that addresses drain-induced barrier lowering (DIBL) that is experienced in a transistor junction. An embodiment includes a drain in contact with the substrate. In one embodiment, the drain is a vertically oriented conductor that is positioned at and below the junction in order to intersect a significant amount of the electrical field created at the junction.

The following description includes terms, such as upper, lower, first, second, etc. that are used for descriptive purposes only and are not to be construed as limiting. The embodiments of an apparatus or article of the present invention described herein can be manufactured, used, or shipped in a number of positions and orientations. The terms "semiconductor" and "substrate" generally refer to the physical object that is the basic workpiece that is transformed by various process operations into the desired integrated circuit. A semiconductive substrate is typically made of semiconductive material that has been singulated from a wafer after integrated processing. Wafers may be made of semiconducting, non-semiconducting, or combinations of semiconducting and non-semiconducting material. Examples include silicon-on-oxide (SOI), silicide on a substrate, or a lattice-matched conductor. A substrate may also be a dielectric material such as silica glass or the like, onto which semiconductive material is formed.

Reference will now be made to the drawings wherein like structures will be provided with like reference designations. In order to show the structures of embodiments of the present invention most clearly, the drawings included herein are diagrammatic representations of integrated circuit structures. Thus, the actual appearance of the fabricated structures, for example in a photomicrograph, may appear different while still incorporating the essential structures of embodiments of the present invention. Moreover, the drawings show only the structures necessary to understand embodiments of the present invention. Additional structures known in the art have not been included to maintain the clarity of the drawings.

Figure 1:
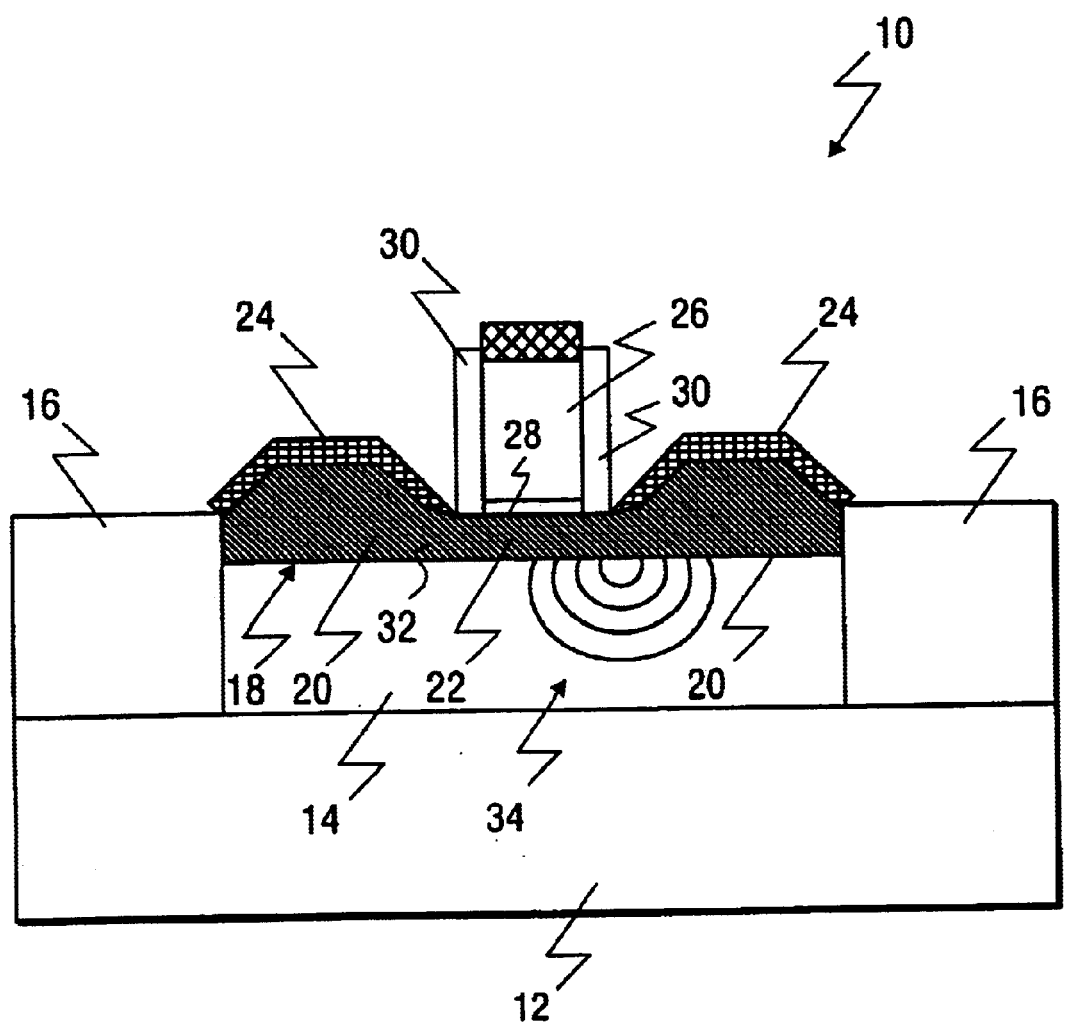
FIG. 1 is an elevational cross-section of an existing semiconductor structure.
Figure 2:
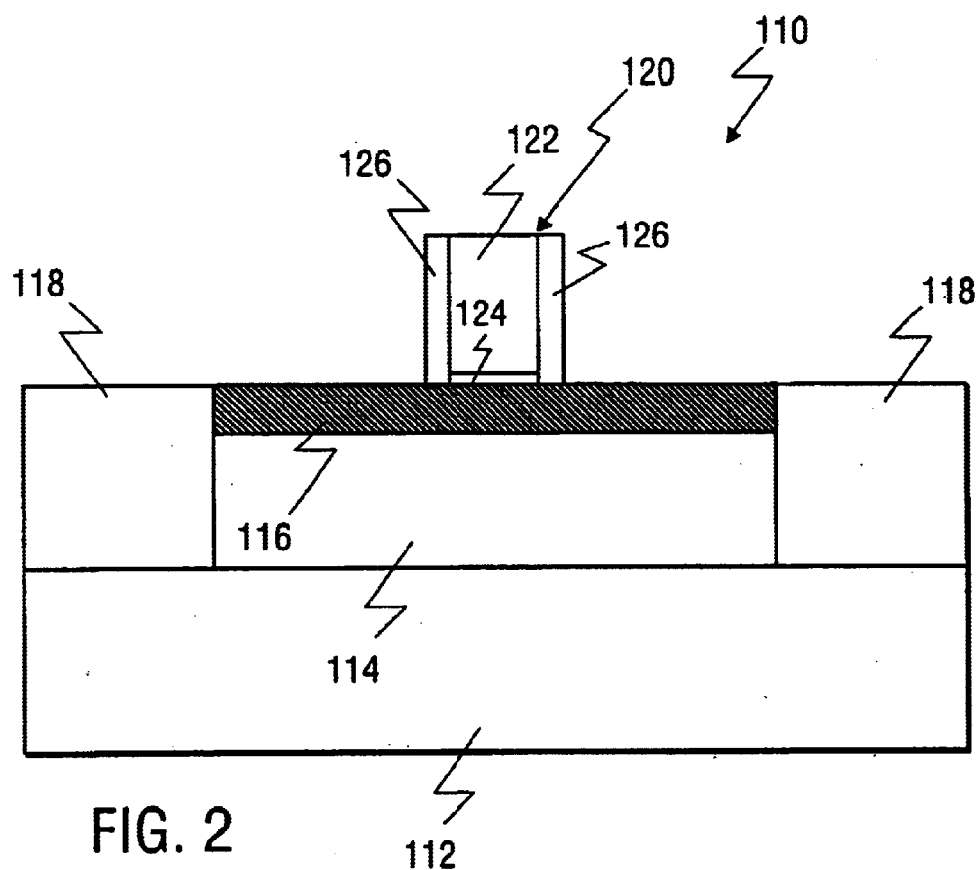
FIG. 2 is an elevational cross-section of the semiconductor structure during a process flow according to a first general embodiment.

FIG. 2 is a cross-section of a semiconductor structure 110 during fabrication according to a first general embodiment. In one embodiment, semiconductor structure 110 includes a silicon-on-insulator (SOI) substrate that has a substrate 112 that is optionally semiconductive, an insulator 114, and a semiconductive layer 116. Additionally, an isolation structure 118 establishes lateral boundaries of a transistor that is being fabricated. A gate stack 120 is disposed on semiconductive layer 116. Gate stack 120 includes a gate electrode 122, a gate dielectric layer 124, and a first spacer 126.

Figure 3:
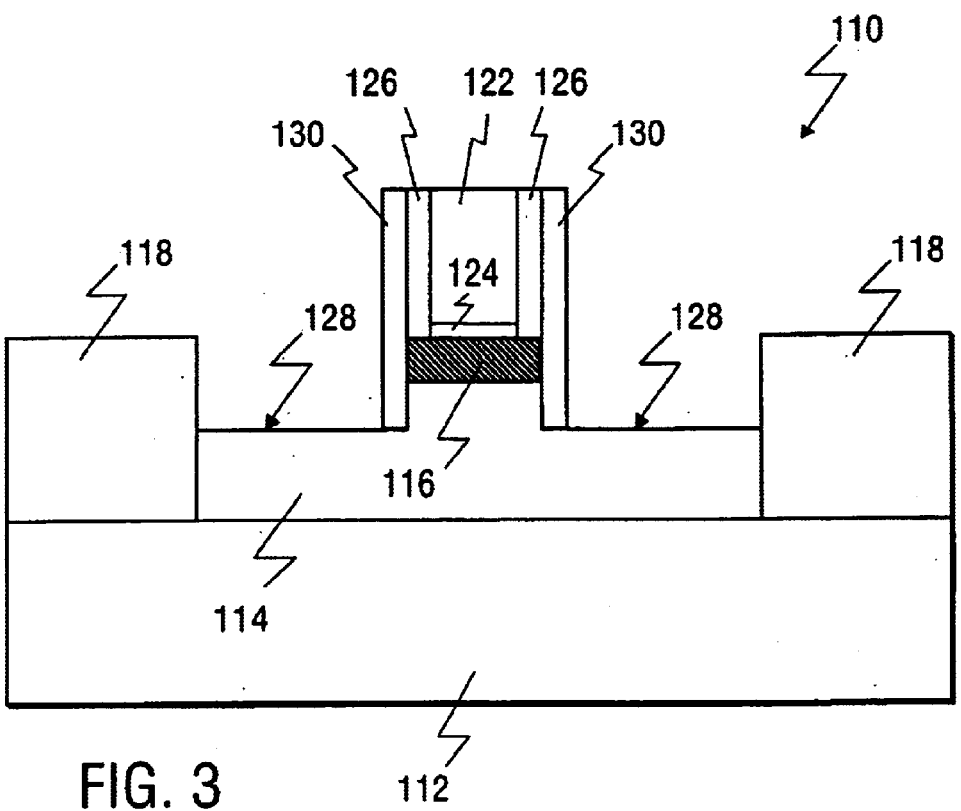
FIG. 3 is an elevational cross-section of the semiconductor structure depicted in FIG. 2 after further processing.

Processing according to an embodiment commences with an etch. FIG. 3 illustrates the result of a first etch during which a first recess 128 is formed. First recess 128 bottoms out into, but does not necessarily penetrate through insulator 114. Thereafter, a dielectric film is deposited such as by chemical vapor deposition (CVD), and spacer etched to form a second spacer 130. In one embodiment, second spacer 130 is formed according to a known technique, and is a dielectric selected from an oxide, a nitride, an oxynitride, and the like.

Figure 4:
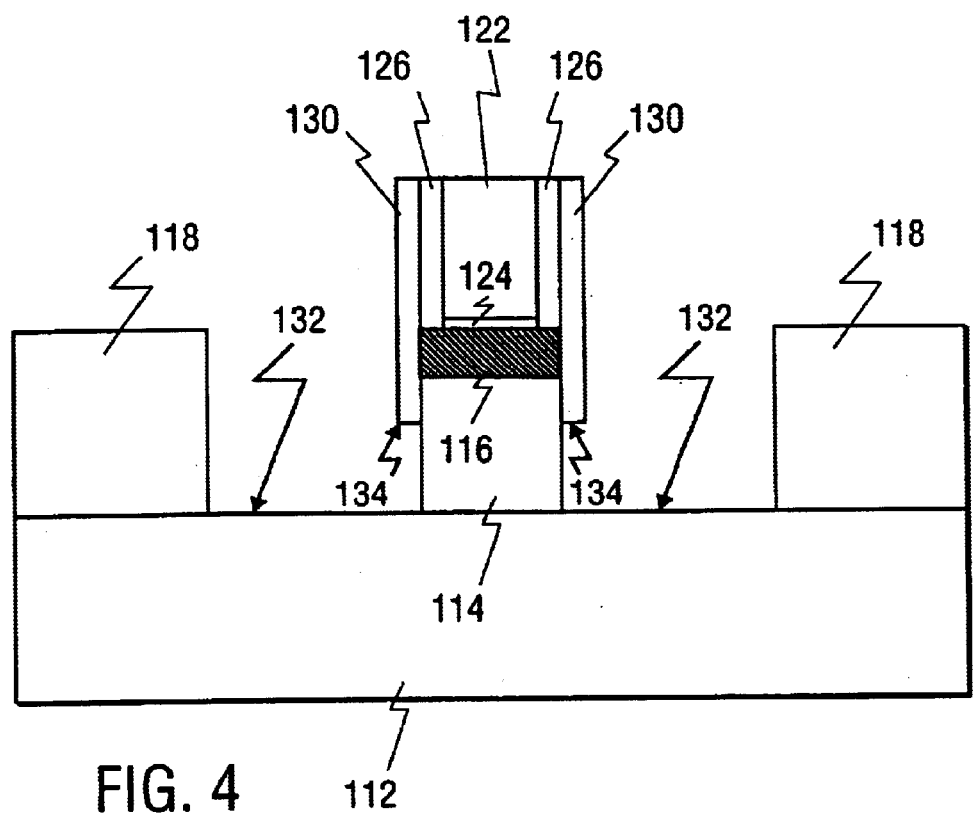
FIG. 4 is an elevational cross-section of the semiconductor structure depicted in FIG. 3 after further processing.

FIG. 4 illustrates further processing. After the formation of second spacer 130, a second etch is carried out that penetrates through insulator 114 and stops on substrate 112. The second etch forms a second recess 132 that also forms an undercut 134 below second spacer 130. Accordingly, the second etch is selective to both the substrate 112 and to second spacer 130. In one embodiment, the second etch is an isotropic wet etch according to known technique. In another embodiment, the second etch is an isotropic dry etch according to known technique.

Figure 5:
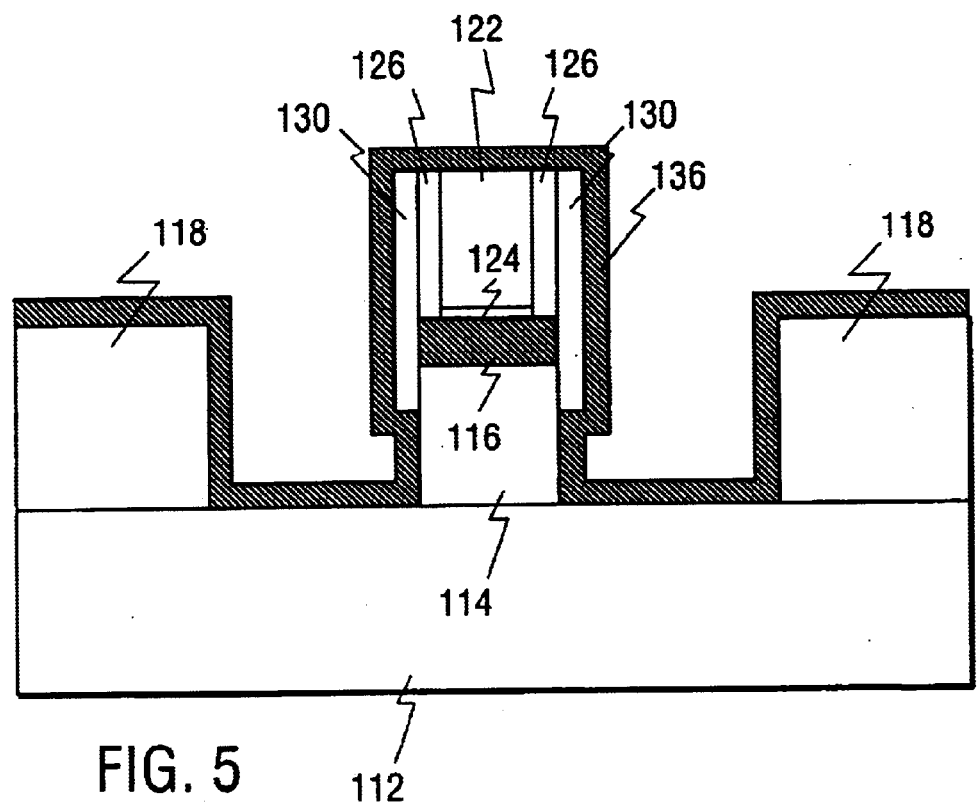
FIG. 5 is an elevational cross-section of the semiconductor structure depicted in FIG. 4 after further processing.

FIG. 5 illustrates further processing. After the formation of second recess 132, a conductive film 136 is formed by CVD. In one embodiment, conductive film 136 is a metal. In one embodiment, conductive film 136 is a refractory metal such as titanium, zirconium, hafnium, and the like. Other refractory metals for conductive film 136 include nickel, cobalt, palladium, platinum, and the like. Other refractory metals for conductive film 136 include chromium, molybdenum, tungsten, and the like. Other refractory metals for conductive film 136 include scandium, yttrium, lanthanum, cerium, and the like. In another embodiment, conductive film 136 is a metal nitride. The metal in a metal nitride film may be selected from one of the aforementioned metals. In one embodiment, conductive film 136 is titanium nitride in either stoichiometric or other solid solution ratios.

Figure 6:
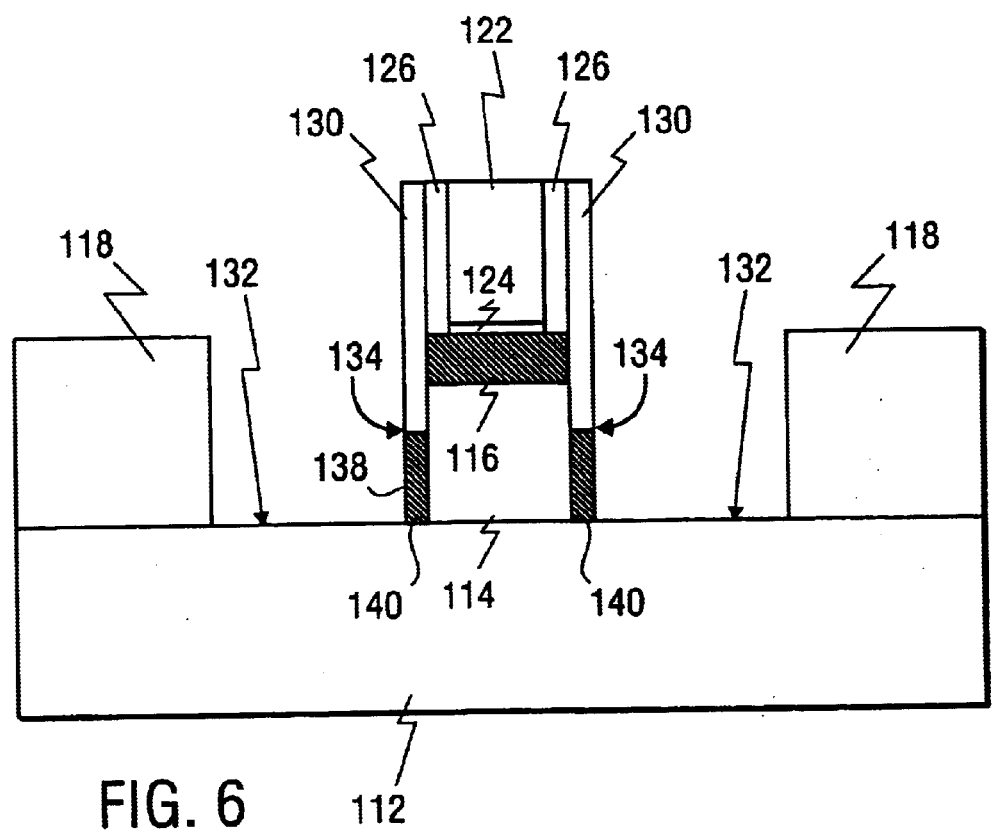
FIG. 6 is an elevational cross-section of the semiconductor structure depicted in FIG. 5 after further processing.

After the formation of conductive film 136, an anisotropic etch process is done to substantially remove all of conductive film 136, except that portion that escapes the etch beneath undercut 134 (FIG. 4). FIG. 6 depicts semiconductor structure 110 after the anisotropic etch. A contact 138 is the remainder of conductive film 136 (FIG. 5) after the etch. Contact 138 extends at a bottom end 140 from substrate 112, but it does not terminate in connection with what remains of semiconductive layer 116. In one embodiment, contact 138 has a height-to-width (aspect) ratio of greater than or equal to about 1. In one embodiment, contact 138 has an aspect ratio of greater than or equal to about 2. In one embodiment, contact 138 has an aspect ratio of greater than or equal to about 10.

Figure 7:
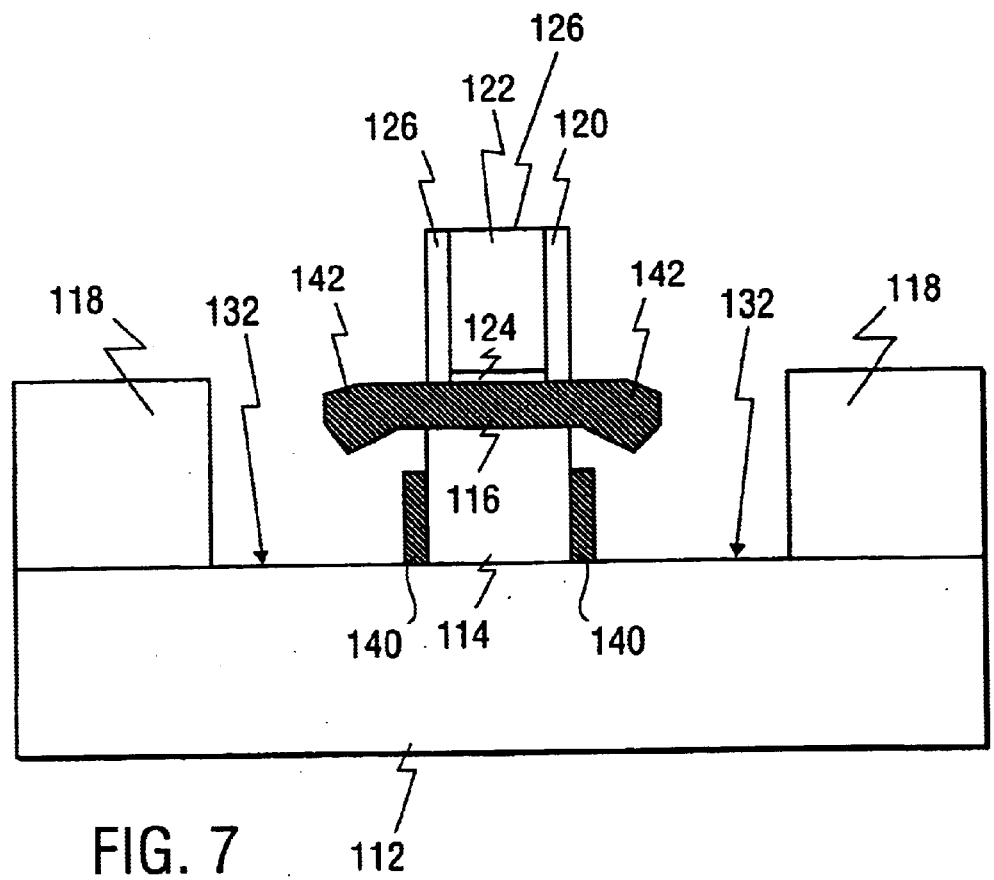
FIG. 7 is an elevational cross-section of the semiconductor structure depicted in FIG. 6 after further processing.
Figure 8:
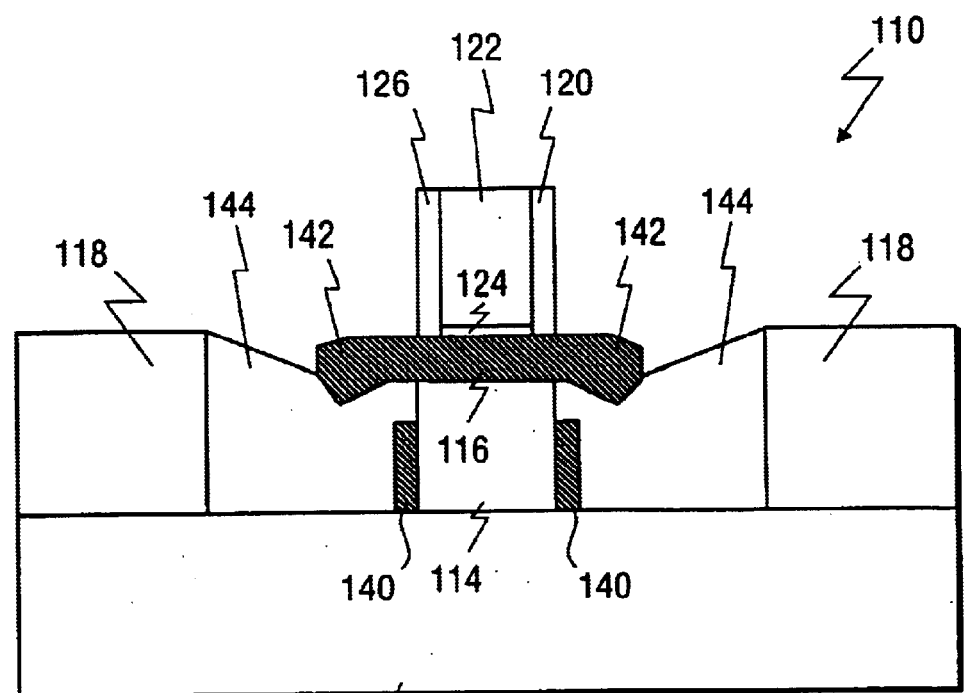
FIG. 8 is an elevational cross-section of the semiconductor structure depicted in FIG. 7 after further processing.

FIG. 7 illustrates the result of another etch and an epitaxial growth process. Second spacer 130 (FIG. 6) is stripped in order to expose what remains of semiconductive layer 116 (FIG. 6). Thereafter, an epitaxial first growth 142 laterally extends from the edge of semiconductive layer 116. Epitaxial growth processing is known in the art, and a supply material such as silane may be used for the formation of epitaxial first growth 142. After the formation of epitaxial first growth 142, a dielectric material 144 is deposited into second recess 132 as depicted in FIG. 8. In one embodiment, dielectric material 144 is deposited into second recess 132 by a first CVD of a dielectric and a center masking over gate stack 120, followed by an etch.

Figure 9:
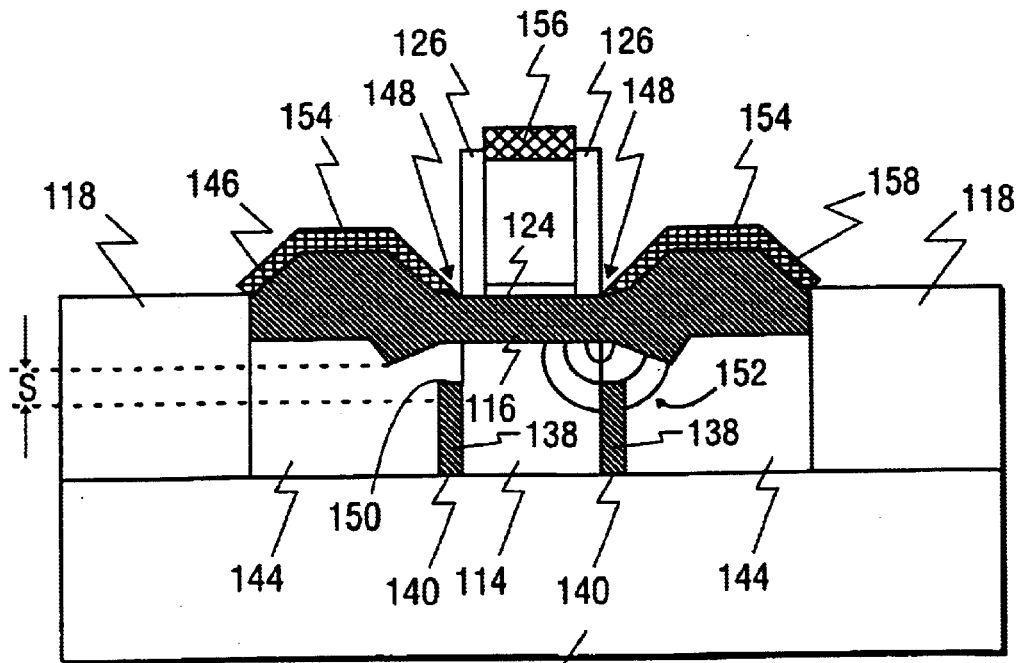
FIG. 9 is an elevational cross-section of the semiconductor structure depicted in FIG. 8 after further processing.

After the formation of dielectric material 144, further epitaxial growth is carried out to form an epitaxial second growth 146 as illustrated in FIG. 9. Epitaxial second growth 146 is depicted with reference numeral 146 only on the left side for explanative clarity. The composite of semiconductive layer 116, epitaxial first growth 142, and epitaxial second growth 146 represent a composite source/drain and channel structure. After the formation of epitaxial second growth 146, optional doping thereof may be carried out in order to achieve a preferred doping gradient that forms a junction 148 within the composite source/drain and channel structure. Accordingly, the doping concentration within epitaxial first- and second growth 142 and 146, respectively is higher than in semiconductive layer 116.

In FIG. 9, it is noted that there is a gap with a distance, S, between the bottom extremity of the composite source/drain and channel structure 116, 142, 146, and the top end 150 of contact 138 where it terminates in filler insulator 144. The distance S, that forms the gap, may be extremely small such as on the order of about 100 Å to about 500 Å.

If contact 138 were an entire layer that filled second recess 132, it would act to lower DIBL, but it would also have a larger capacitance due to its larger surface area that is presented opposite to the bottom of composite source/drain and channel structure 116, 142, 146. Because of the inventive process flow, contact 138 is disposed in a substantially self-aligned location beneath junction 148. Accordingly, the electromagnetic lines of force 152 (illustrated only at the right side of FIG. 9 for explanative clarity), terminate into contact 138 instead of into the channel that is semiconductive layer 116.

Further processing is carried out as depicted in FIG. 9, wherein a self-aligned silicide (salicided) contact landing 154 is formed. Additionally and simultaneously, a salicided gate electrode 156 is formed.

Salicidation is carried out after the optional source/drain implant at an elevated epitaxial tip 158 of epitaxial second growth 146. In one embodiment, a refractory conductive film is blanket deposited. The refractory metal may be selected from nickel (Ni), cobalt (Co), palladium (Pd) and the like. The refractory metal may also be selected from aluminum (Al), titanium (Ti), tungsten (W), ti-tungsten (TiW), chromium (Cr), and the like. Other refractory metals may be selected according to integration with a given process flow and/or a given end product. In an embodiment of the present invention, a cobalt film is deposited to a thickness in a range from about 100 Å to about 200 Å. The refractory metal film may be formed by any well-known method including sputter deposition such as physical vapor deposition (PVD) or by CVD. An Endura® system, made by Applied Materials (AMAT) of Santa Clara, Calif. can be used to sputter deposit the refractory metal film.

After the formation of the refractory metal film, a protective layer of for example titanium nitride, is deposited directly onto the refractory metal film. In one embodiment, the protective layer is titanium nitride that is deposited to a thickness in a range from about 500 Å to about 200 Å. The protective layer can be formed by any well-known technique such as by PVD with an Applied Materials Endura® system or it can be formed by CVD. The protective layer protects the underlying refractory metal film from oxidation during a subsequent silicide anneal.

After the formation of the protective layer, semiconductor structure 110 is heated to a temperature and for a period of time sufficient to cause the refractory metal film to react with underlying silicon to form a refractory metal silicided contact landing 154 as depicted in FIG. 9. The heating process may be carried out in an inert atmosphere such as argon (Ar) or in some instances, nitrogen ($N_2$) and a temperature in a range from about 400° C. to about 500° C. for a time range from about 45 seconds to about 2 minutes. In one embodiment, heating is carried out at about 450° C. for about 90 seconds. Semiconductor structure 110 can be suitably annealed in an AMAT 5000® or AMAT 5200® RTP tool. Such a heating process causes the reaction of the refractory metal film and underlying silicon of epitaxial first- and second growth 142 and 146, respectively to form a low sheet-resistance phase film.

Any unsalicided refractory metal film is removed, for example, with a 50:1 buffered HF wet etch for a time period from about 90 seconds to about 150 seconds. In one embodiment, the HF wet etch is carried out for about 2 minutes. After the wet etch, the low sheet-resistance phase salicided contact landing 154 remains on the source/drain regions. Similarly, salicided gate electrode 156 is exposed.

Figure 10:
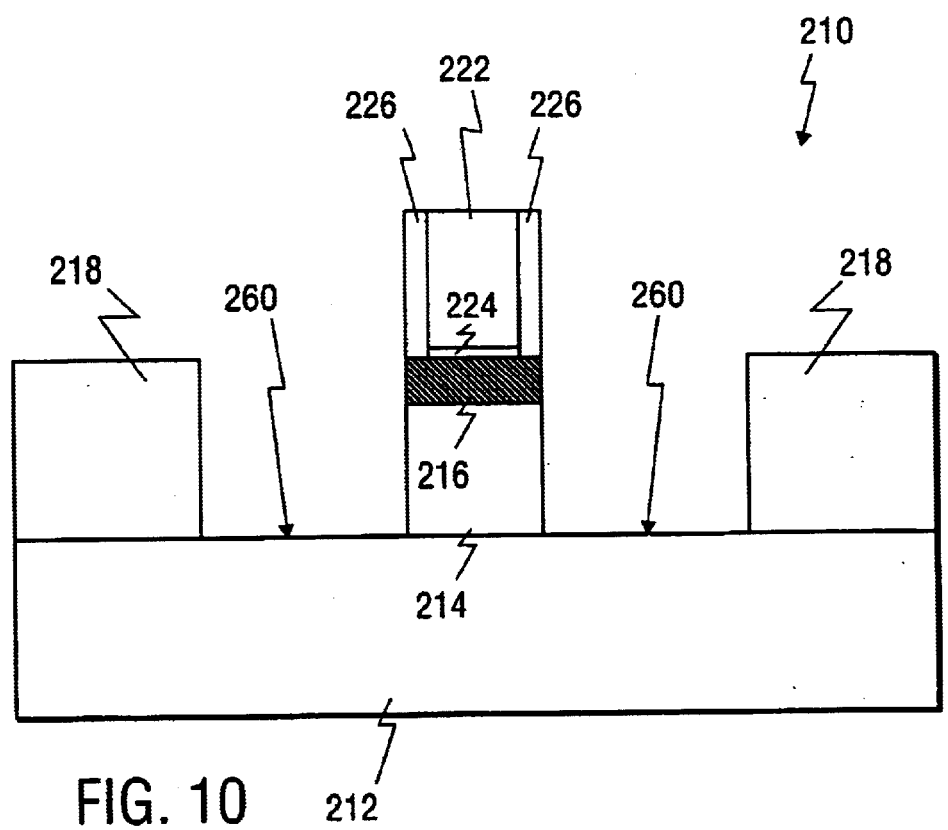
FIG. 10 is an elevational cross-section of the semiconductor structure during a process flow according to a second general embodiment.
Figure 11:
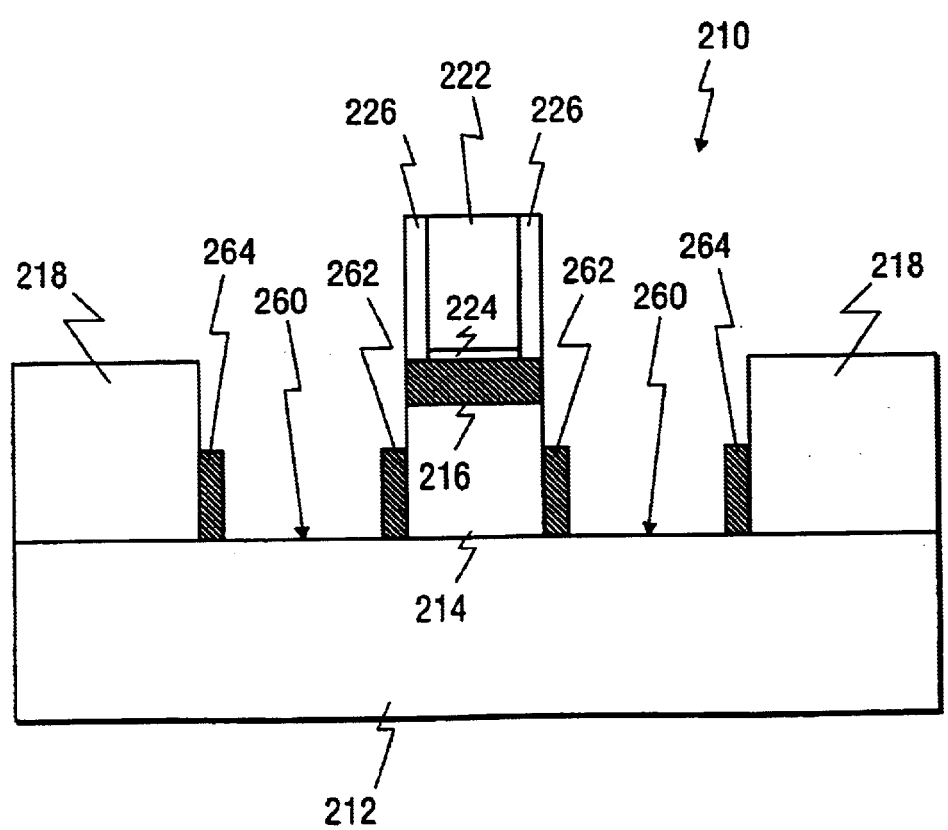
FIG. 11 is an elevational cross-section of the semiconductor structure depicted in FIG. 10 after further processing.

A second general process flow embodiment is illustrated beginning in FIG. 2, and proceeding to FIG. 10. Semiconductor structure 110 (FIG. 2, but hereinafter referred to as semiconductor structure 210) includes a gate stack 220 that includes a gate electrode 122, a gate dielectric layer 124, and a spacer 126. First by a gate stack self-aligned etch, a recess 260 is etched that stops on substrate 212 that is optionally semiconductive. Further processing is depicted in FIG. 11. After the formation of recess 260, a conductive film is formed by CVD and two angled, directional etches and an optional orthogonal directional spacer etch are done that leave an inside contact 262 and an outside contact 264 in recess 260. Inside contact 262 is self-aligned to one edge of gate stack 220. Outside contact 264 is spaced apart and opposite inside contact 262. In one embodiment, inside contact 238 has a aspect ratio of greater than or equal to about 1. In one embodiment, inside contact 238 has an aspect ratio of greater than or equal to about 2. In one embodiment, inside contact 238 has an aspect ratio of greater than or equal to about 10. In any event, inside contact 262 does not touch semiconductive layer 216.

In one embodiment, the conductive film is a metal that is etched to form inside contact 262 and outside contact 264. In one embodiment, the conductive film is a refractory metal such as titanium, zirconium, hafnium, and the like. Other refractory metals for the conductive film include nickel, cobalt, palladium, platinum, and the like. Other refractory metals for the conductive film include chromium, molybdenum, tungsten, and the like. Other refractory metals for the conductive film include scandium, yttrium, lanthanum, cerium, and the like. In another embodiment, the conductive film is a metal nitride. The metal in a metal nitride film may be selected from one of the aforementioned metals. In one embodiment, the conductive film is titanium nitride in either stoichiometric or other solid solution ratios.

Figure 12:
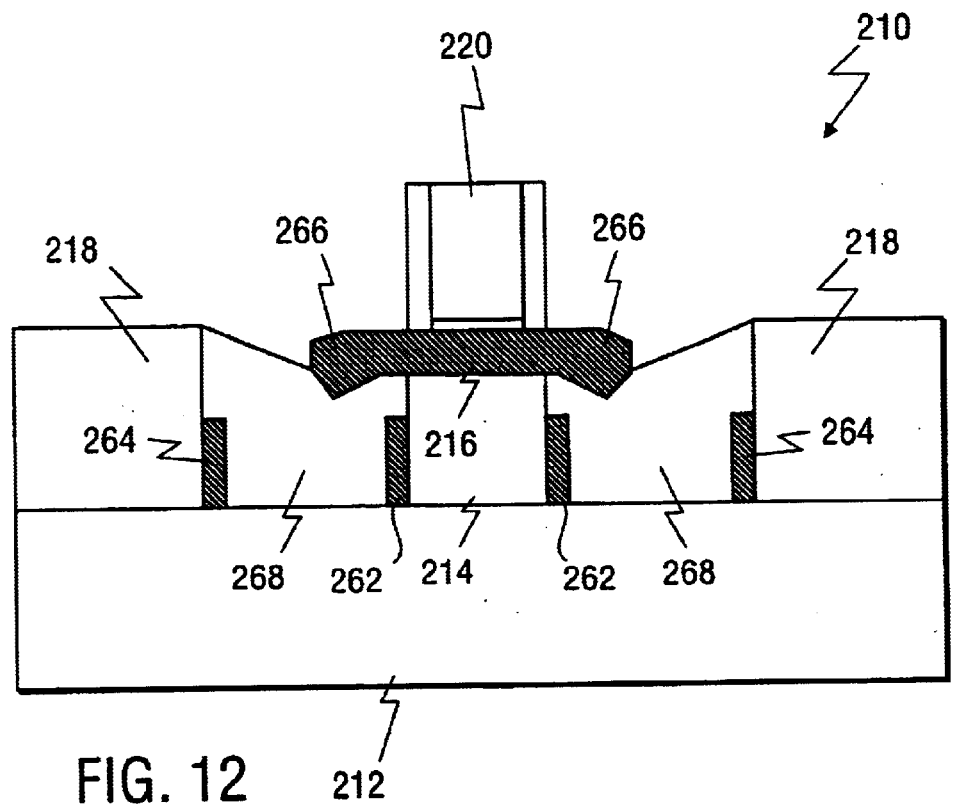
FIG. 12 is an elevational cross-section of the semiconductor structure depicted in FIG. 11 after further processing.

Further processing is carried out according to a process flow embodiment. FIG. 12 illustrates the result of an epitaxial growth process. An epitaxial first growth 266 laterally extends from the edge of semiconductive layer 216. After the formation of epitaxial first growth 266, a dielectric material 268 is deposited into recess 260. In one embodiment, dielectric material 268 is deposited into recess 260 by a first CVD of a dielectric material and a center masking over gate stack 220, followed by an etch.

Figure 13:
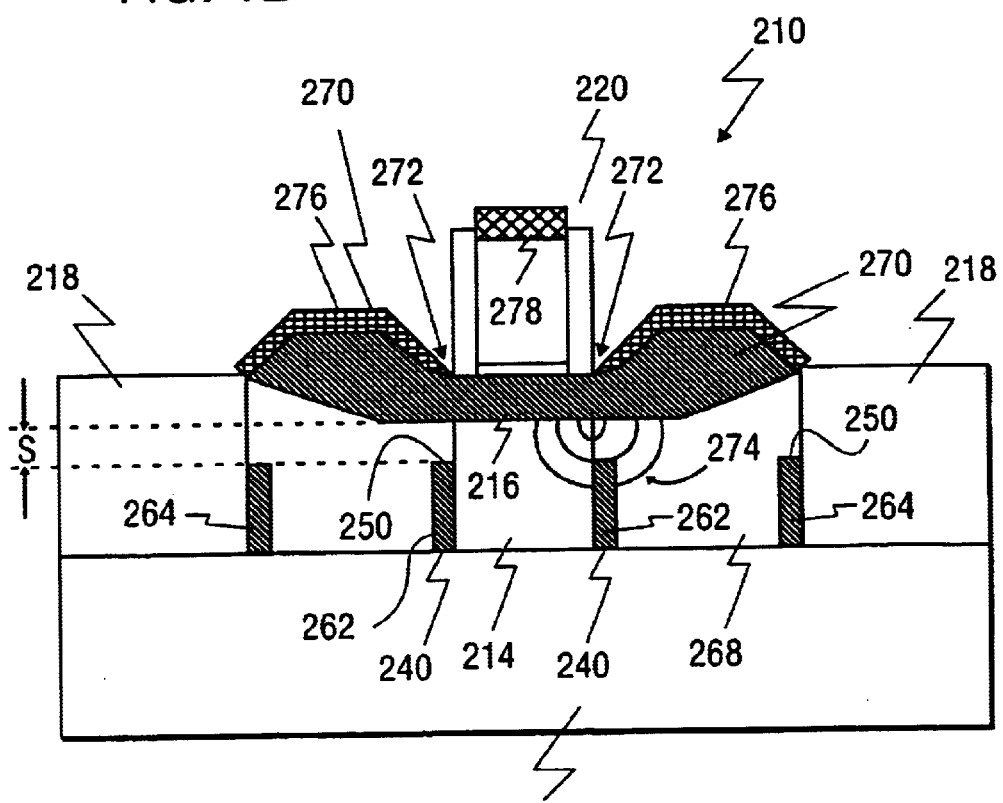
FIG. 13 is an elevational cross-section of the semiconductor structure depicted in FIG. 12 after further processing.

After the formation of dielectric material 268, further epitaxial growth is carried out to form an epitaxial second growth 270 as illustrated in FIG. 13. Epitaxial second growth 270 is depicted with reference numeral 270 only on the left side for explanative clarity. The composite of semiconductive layer 216, epitaxial first growth 266, and epitaxial second growth 270 represent a composite source/drain and channel structure. After the formation of epitaxial second growth 270, optional doping thereof may be carried out in order to achieve a preferred doping gradient that forms a junction 272 within the composite source/drain and channel structure. Accordingly, the doping concentration within epitaxial first- and second growth 266 and 270 respectively is higher than in semiconductive layer 216.

In FIG. 13, it is noted that there is a gap with a distance, S, between the bottom extremity of the composite source/drain and channel structure 216, 266, 270, and the top end 250 of inside- and outside contacts 262 and 264, respectfully, where they terminate in dielectric material 268. The distance, S of the gap may be extremely small such as on the order of about 100 Å to about 500 Å.

Because of the inventive process flow according to this second general embodiment, inside contact 262 is disposed in a substantially self-aligned location beneath junction 272. Accordingly, a significant amount of the electrical field (illustrated by the electromagnetic lines of force 274 only at the right side of FIG. 13 for explanative clarity), terminates into inside contact 262 instead of into the channel that is semiconductive layer 216.

Further processing is carried out as depicted in FIG. 13, wherein a salicided contact landing 276 is formed. Additionally and simultaneously, a salicided gate electrode 278 is formed. Salicidation is carried out as set forth herein.

Figure 14:
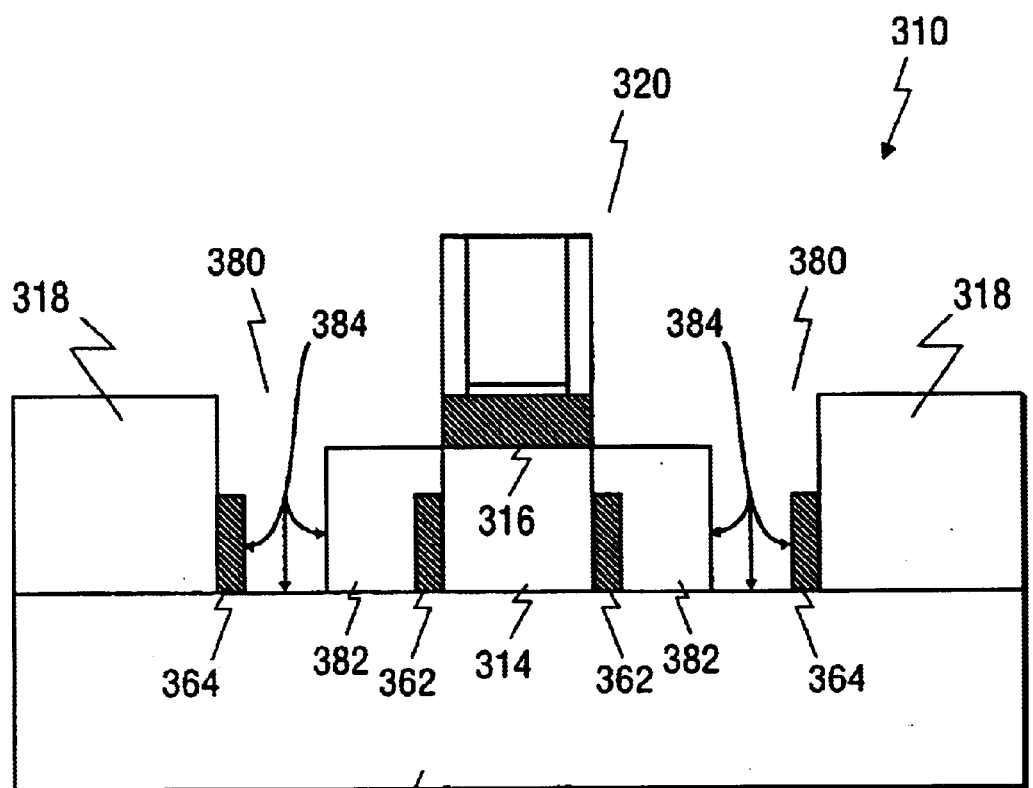
FIG. 14 is an elevational cross-section of the semiconductor structure during a process flow according to a third general embodiment.
Figure 15:
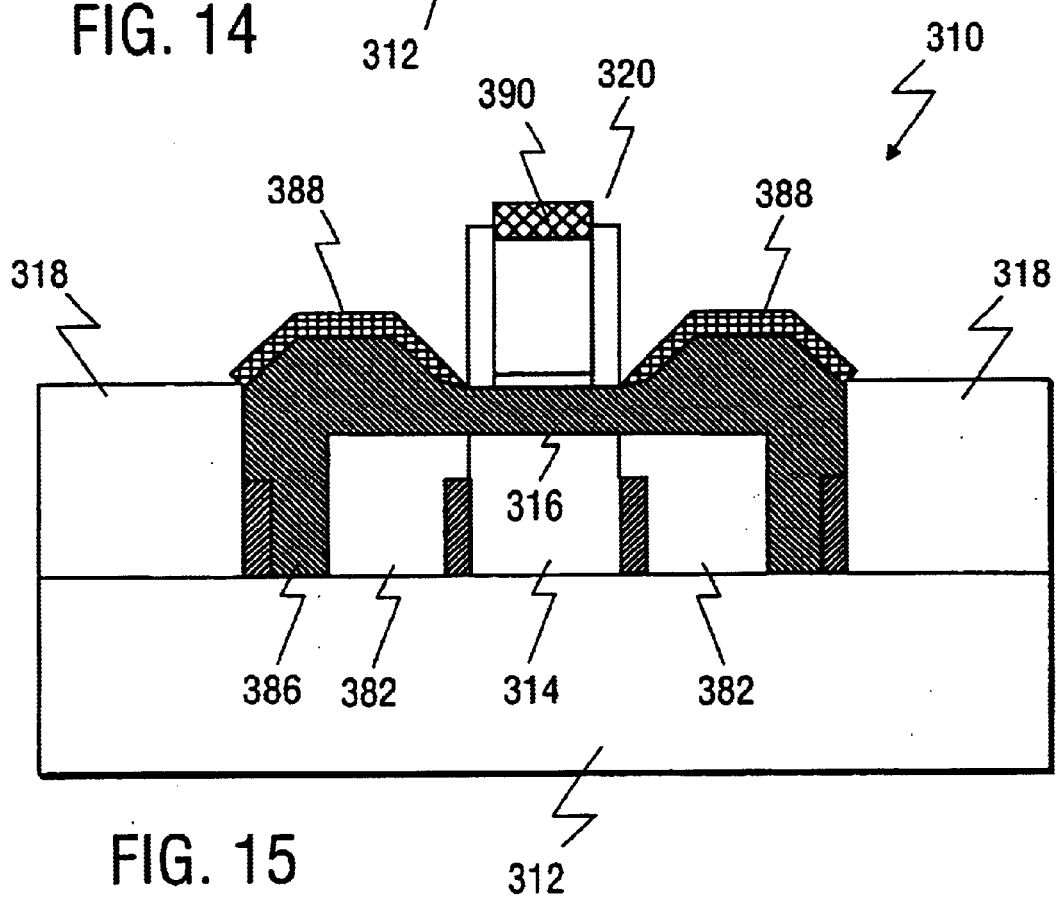
FIG. 15 is an elevational cross-section of the semiconductor structure depicted in FIG. 10 after further processing.

In a third general embodiment, processing begins on a semiconductor structure 110 (depicted in FIG. 2, but hereinafter referred to as semiconductive structure 310) depicted in FIGS. 14 and 15. Processing begins similar to the second general embodiment in that inside 362 and outside contacts 364 are formed in a recess 380. Thereafter, a dielectric material 382 is deposited and patterned to form a channel 384 that opens to substrate 312 that is optionally semiconductive. Channel 384 may or may not expose outside contact 364. In the embodiment depicted in FIG. 14, channel 384 exposes outside contact 364.

Further processing, depicted at FIG. 15, includes epitaxial growth 386 that originates both at semiconductor layer 316 and at substrate 312. Under process flow embodiments similar to the first and second general embodiments, a salicided contact landing 388 and a salicided gate electrode 390 are produced.

It is noted that throughout the written description, the structures designated "contact" 138, 262, and 362 are not the traditional contact structure as is often used. Rather, the contacts 138, 262, and 362 act more as antennae that intercept and drain some of the electromagnetic energy that is represented by the lines of force 152 and 274.

Figure 16:
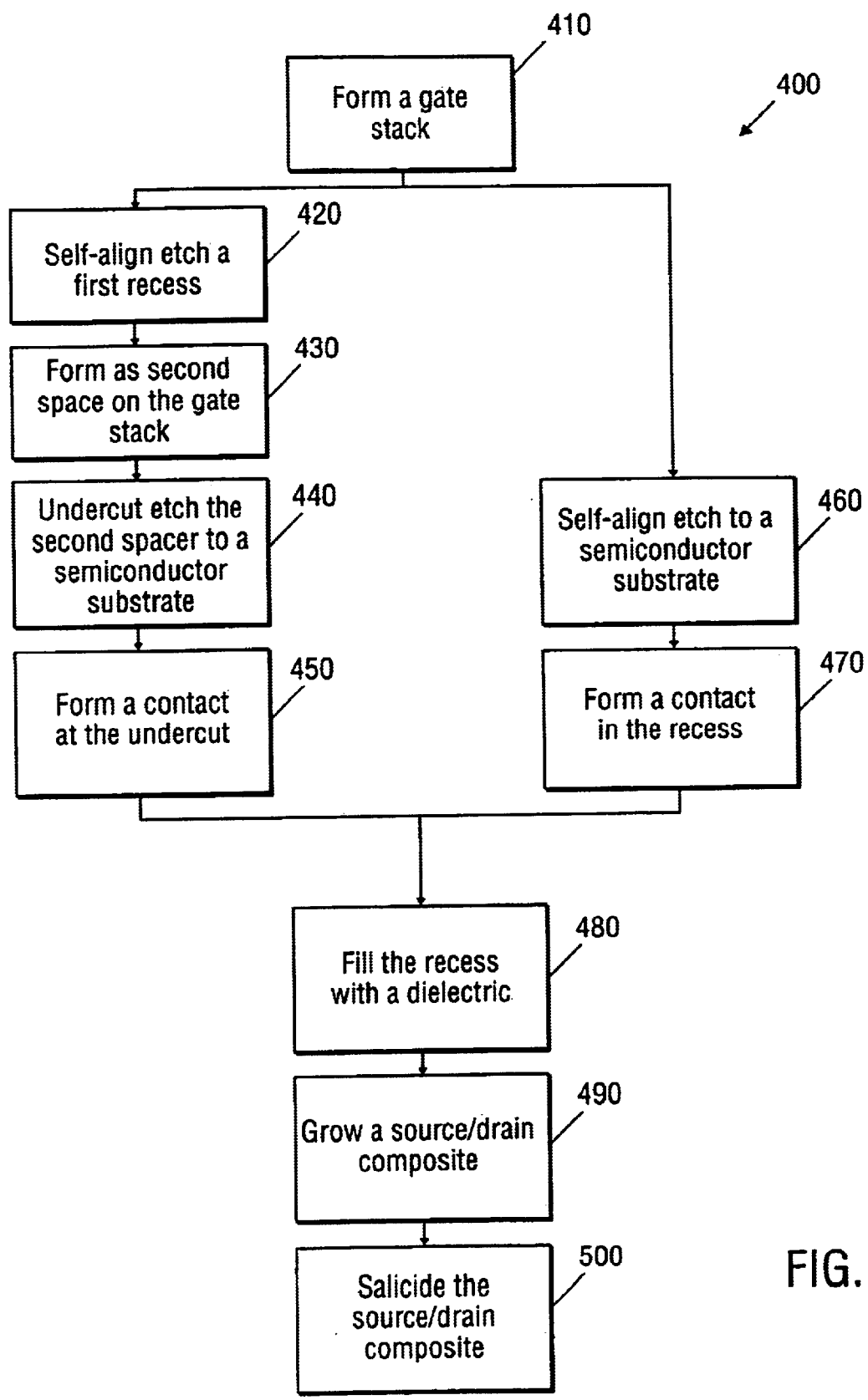
FIG. 16 is a chart that describes a process flow embodiment.

FIG. 16 is a process flow diagram of an embodiment. The process flow 400 includes forming 410 a gate stack including a first spacer on a semiconductive layer. Next a first etching 420 is done through the semiconductive layer by a gate stack self-aligned etch. Thereafter, forming a second spacer 430 is done at the gate stack. After forming the second spacer 430, a second etching 440 is done through an insulator layer disposed beneath the semiconductive layer to form an undercut beneath the second spacer. After the undercut is achieved, a contact is formed 450 at the undercut. In an alternative process, after conducting a gate-stack self-aligned etch 460 that exposes the semiconductive substrate, a contact is formed 470 that is connected to the semiconductive substrate.

In the above two process flows, after forming the contact, the recess is filled 480, and a composite source/drain and channel structure is grown 490. Finally if selected, salicidation 500 is carried out on the source/drain regions.

In a method embodiment, the method of reducing DIBL is carried out. The method is undertaken by operating a transistor that has structure according to embodiments set forth herein. The structure may be part of a larger microelectronic device. The microelectronic device may be a sub-component of a variety of electronic systems, such as a clock, a television, a cell phone, a personal computer, an automobile, an industrial control system, an aircraft and others. In another method embodiment, the microelectronic device is operated at a frequency in a range between about 1 MHz and about 2 GHz. In another embodiment, the microelectronic device is operated at a frequency in a range between about 33 MHz and about 1 GHz.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. An article comprising:
    a semiconductor layer disposed above a substrate, the semiconductor layer including an epitaxial composite source/drain structure and a channel structure, the epitaxial composite source/drain structure having a raised tip, the raised tip having a salicided film disposed thereon, the semiconductor layer having epitaxial semiconductive material extending there from, the epitaxial semiconductive material laterally bounded by an isolation structure;
    a gate stack disposed on the semiconductor layer; and
    a contact that extends at one end from the substrate and terminates at the other end in an insulator.

2. The article according to claim 1, wherein the substrate includes a silicon-on-insulator (SOI) and the contact terminates in the SOI insulator.

3. The article according to claim 1, wherein the gate stack includes a salicided gate layer.

4. The article according to claim 1, wherein the semiconductive layer includes an epitaxial composite source/drain and channel structure, further including:
    a channel region in the semiconductive layer;
    a junction disposed between the channel region and the source structure or the drain structure.

5. An article comprising:
    a semiconductor layer disposed above a substrate, the semiconductor layer including an epitaxial composite source/drain structure and a channel structure, the epitaxial composite source/drain structure having a channel region in the semiconductive layer, a junction disposed between the channel region and the source structure or the drain structure, and a raised tip, the raised tip having a salicided film disposed thereon,
    a gate stack disposed on the semiconductor layer; and
    a contact that extends at one end from the substrate and terminates at the other end in an insulator, wherein the contact is self-aligned below the junction.

6. An article comprising:
    a semiconductor layer disposed above a substrate, the semiconductor layer including an epitaxial composite source/drain structure and a channel structure, the epitaxial composite source/drain structure having a raised tip, the raised tip having a salicided film disposed thereon;
    a gate stack disposed on the semiconductor layer; and
    a contact that extends at one end from the substrate and terminates at the other end in an insulator, the contact having an aspect ratio that is greater than or equal to 1.

7. An article comprising:
    a semiconductor layer disposed above a substrate, the semiconductor layer including an epitaxial composite source/drain structure and a channel structure, the epitaxial composite source/drain structure having a channel region in the semiconductive layer, a junction disposed between the channel and the source or the drain, and a raised tip, the raised tip having a salicided film disposed thereon;
    a gate stack disposed on the semiconductor layer;
    a first contact that extends at one end from the substrate and terminates at the other end in an insulator, the first contact is self-aligned below the junction; and
    a second contact that extends at one end from the substrate and terminates at the other end in the insulator, the second contact spaced apart from the first contact.

8. An article comprising:
    a semiconductor layer disposed above a substrate;
    a gate stack disposed on the semiconductor layer; and
    a contact that extends at one end from the substrate and terminates at the other end in an insulator, the contact comprising stoichiometric titanium nitride.

9. An article comprising:
    a semiconductor layer disposed above a substrate;
    a gate stack disposed on the semiconductor layer; and
    a contact that extends at one end from the substrate and terminates at the other end in an insulator, the contact connecting at a bottom end to the substrate, the contact not connecting at a top end to the semiconductor layer, the top end terminating in the insulator approximately 10 nm–40 nm below a bottom extremity of the semiconductor layer.

10. An article comprising:
    a semiconductor layer disposed above a substrate, the semiconductor layer comprising a source/drain region;
    a gate stack disposed on the semiconductor layer; and
    a contact that extends at one end from the substrate and terminates at the other end in an insulator, the contact intercepting a significant amount of electrical field energy of a junction of the source drain region.

* * * * *